United States Patent
Jung et al.

(10) Patent No.: US 10,699,918 B2
(45) Date of Patent: Jun. 30, 2020

(54) CHEMICAL SUPPLY UNIT AND APPARATUS FOR TREATING A SUBSTRATE

(71) Applicant: SEMES CO., LTD., Chungcheongnam-do (KR)

(72) Inventors: Buyoung Jung, Chungcheongnam-do (KR); Jin Tack Yu, Chungcheongnam-do (KR); Gil Hun Song, Chungcheongnam-do (KR); Sun Yong Park, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 284 days.

(21) Appl. No.: 15/484,377

(22) Filed: Apr. 11, 2017

(65) Prior Publication Data
US 2017/0316958 A1    Nov. 2, 2017

(30) Foreign Application Priority Data
Apr. 29, 2016   (KR) .......................... 10-2016-0052951

(51) Int. Cl.
*H01L 21/67* (2006.01)
*B05B 1/14* (2006.01)
*B08B 3/08* (2006.01)

(52) U.S. Cl.
CPC .......... *H01L 21/67023* (2013.01); *B05B 1/14* (2013.01); *B08B 3/08* (2013.01); *H01L 21/6708* (2013.01); *H01L 21/67051* (2013.01)

(58) Field of Classification Search
CPC ................................................ H01L 21/67023
See application file for complete search history.

(56) References Cited

U.S. PATENT DOCUMENTS

| | | | | |
|---|---|---|---|---|
| 3,967,090 A | * | 6/1976 | Hamasaki | ............. B23K 9/013 219/70 |
| 6,308,361 B1 | * | 10/2001 | Matsuda | .................. B08B 1/00 15/102 |
| 2001/0029150 A1 | * | 10/2001 | Kimura | ................... B24B 9/065 451/41 |
| 2012/0227770 A1 | | 9/2012 | Kaneko et al. | |
| 2013/0304419 A1 | * | 11/2013 | Nakamura | ........ H01L 21/67288 702/183 |
| 2013/0319457 A1 | | 12/2013 | Lee et al. | |

FOREIGN PATENT DOCUMENTS

| | | |
|---|---|---|
| CN | 105280523 A | 1/2016 |
| JP | H09-270410 A | 10/1997 |
| JP | 2004-016878 A | 1/2004 |

(Continued)

*Primary Examiner* — Jason Y Ko
(74) *Attorney, Agent, or Firm* — Carter, DeLuca & Farrell LLP

(57) ABSTRACT

Provided is a substrate treating apparatus. The substrate treating apparatus comprises: a housing having a treating space therein; a spin head for supporting and rotating a substrate in the treating space; and a chemical supply unit having an injection nozzle for supplying a chemical to the substrate which is supported by the spin head, wherein the injection nozzle comprises a nozzle body, and wherein the nozzle body comprises an inner space for receiving a chemical and minute holes which are connected with the inner space for discharging the chemicals to downward.

7 Claims, 10 Drawing Sheets

(56) References Cited

FOREIGN PATENT DOCUMENTS

| | | |
|---|---|---|
| JP | 3845424 B2 | 11/2006 |
| JP | 2008126200 A | 6/2008 |
| JP | 2016-032107 A | 3/2016 |
| KR | 10-0380666 B1 | 7/2003 |
| KR | 2005-0073103 A | 7/2005 |
| KR | 2006-0017350 A | 2/2006 |
| KR | 2006-0057113 A | 5/2006 |
| KR | 10-2010-0048402 A | 5/2010 |
| KR | 10-0980704 B1 | 9/2010 |
| KR | 10-1022779 B1 | 3/2011 |
| KR | 10-1157528 B1 | 6/2012 |
| KR | 10-1162390 B1 | 7/2012 |
| KR | 10-2012-0103465 A | 9/2012 |
| KR | 2013-0029003 A | 3/2013 |
| KR | 10-1555382 B1 | 9/2015 |
| KR | 2015-0138929 A | 12/2015 |
| WO | 2016/025187 A1 | 2/2016 |

\* cited by examiner $F_{Convention} = (\pi\sigma cso\theta)D$ $F_{Porous} = (\pi\sigma cso\theta)(d_1 + \cdots + d_{63})$ $F_{Porous} = 7.97 \times F_{Convention}$

CHEMICAL SUPPLY UNIT AND APPARATUS FOR TREATING A SUBSTRATE

CROSS-REFERENCE TO RELATED APPLICATIONS

A claim for priority under 35 U.S.C. § 119 is made to Korean Patent Application No. 10-2016-0052951 filed Apr. 29, 2016, in the Korean Intellectual Property Office, the entire contents of which are hereby incorporated by reference.

BACKGROUND OF THE INVENTION

The present invention disclosed herein relates to a substrate treating apparatus. More specifically it relates to a chemical supply unit for supplying a chemical fluid for substrate treatment and apparatus for substrate treating.

Conventionally, in a method for manufacturing a semiconductor substrate, processes such as a film deposition process, an etching process and a cleaning process are performed. Particularly, a wet etching process and a cleaning process treat the semiconductor substrate by using various chemical fluids.

A chemical fluid treating apparatus for supplying a chemical fluid to a substrate treating apparatus such as a wet etching device or a cleaning device controls concentration and temperature of the chemical fluid and supplies the chemical fluid. The chemical fluid treating apparatus obtains a storage tank and controls the concentration of the chemical fluid within the storage tank and supplies to the substrate treating apparatus.

This kind of substrate treating apparatus comprises a spin head seated on the semiconductor substrate and a nozzle for exhausting a chemical fluid to the substrate seated on the spin head. The nozzle is connected to a supply line and the supply line receives a chemical fluid from the chemical fluid treating apparatus and provides it to the nozzle. The supply line comprises a control valve for controlling the amount of chemical fluid supplied to the nozzle and a suck-back valve for removing remaining chemical fluids in the nozzle by suck-backing chemical fluids. When the valve is off and blocks the chemical fluid supplied to the nozzle, the suck-back valve suck-backs the chemical fluids remaining in the nozzle and prevents remaining chemical fluids leaking to the outside.

Recently, chemical liquid drop phenomenon has been increased since the nozzle discharge hole got bigger to increase the amount of chemical liquid discharge. In case of chemical liquid, a surface-active component, and a chemical liquid having low viscosity (IPA, or ozone including solution), a surface tension is very low thereby even with suck-backing, the chemical liquid within the supply line may flow to the nozzle and discharged to the outside. Particularly, when there is an impact from outside, a chemical fluid remaining close to the discharge hole on a path of the nozzle may intermittently drop.

Therefore, excessive chemical fluid contaminates and damages a substrate and when this repeats a desired substrate may not be produced. Moreover, in using a plurality of nozzle discharge holes to clean a substrate, when unwanted chemical liquid runs out, it causes a substrate or a spin head to be contaminated and cleaning efficiency drops. Therefore, it causes a decrease in productivity.

SUMMARY OF THE INVENTION

Embodiments of the inventive concept provide a chemical supply unit and apparatus for treating a substrate which may increase flow rate and prevent chemical dropping.

Embodiments of the inventive concept are not limited to hereinafter, and other objects thereof will be understandable by those skilled in the art from the following descriptions.

Embodiments of the inventive concept provide a substrate treating apparatus comprising: a housing having a treating space therein; a spin head for supporting and rotating a substrate in the treating space; and a chemical supply unit having an injection nozzle for supplying a chemical onto the substrate which is supported by the spin head, wherein the injection nozzle comprises a nozzle body. The nozzle body comprises an inner space filled with a chemical and minute holes which are connected with the inner space for discharging the chemicals downward.

In example embodiments, a cross-sectional shape of the minute holes may be a circle, oval or polygon.

In example embodiments, a distance between the minute holes may be the same.

In example embodiments, a distance between the centers of the minute holes may be less than twice the minute hole diameter.

In example embodiments, the minute holes located at the edge of the minute holes may be provided to be inclined toward the center of the nozzle body so that the chemical can be focused on the center.

In example embodiments, the injection nozzle may comprise a nozzle tip formed concavely in the outer side of the nozzle body toward the center of the nozzle body direction.

In example embodiments, the injection nozzle may comprise a nozzle tip formed to be inclined downward from the center of the nozzle body to the outer side of the nozzle body.

In example embodiments, the injection nozzle may comprise a nozzle tip formed convexly in the outer side of the nozzle body toward the center of the nozzle body direction.

In example embodiments, the injection nozzle may further comprise a guide provided at the edge of the nozzle tip so as to prevent the chemical sprayed through the minute holes.

Embodiments of the inventive concept provide a chemical supply unit comprising: a chemical supply line for providing a flow path to a chemical; an injection nozzle placed in the chemical supply line discharging the chemical, wherein the injection nozzle comprises a nozzle body. The nozzle body comprises an inner space filled with a chemical and minute holes which are connected with the inner space for discharging the chemicals downward.

Example embodiments may further comprise a suck-back valve installed on the chemical supply line and a flow on-off valve installed on the chemical supply line.

In example embodiments, the cross-sectional shape of the minute holes may be a circle, oval or polygon.

In example embodiments, a distance between the centers of the minute holes may be less than twice the minute hole diameter.

In example embodiments, the minute holes located at the edge region of the nozzle body may be provided to be inclined toward the center of the nozzle body so that the chemical can be focused toward the center.

In example embodiments, the nozzle tip of the injection nozzle may be formed concavely from outer side of the nozzle body to the center of the nozzle body so that the chemical injected through each of the minute holes may form a single stream.

In example embodiments, the nozzle tip of the injection nozzle may be formed to be inclined downward from the center of the nozzle body to the outer side of the nozzle body so that the chemical injected through each of the minute holes may form a single stream.

In example embodiments, the nozzle tip of the injection nozzle may be formed convexly in the outer side of the nozzle body toward the center of the nozzle body direction so that the chemical injected through each of the minute holes may form a single stream.

In example embodiments, the injection nozzle may further comprise a guide provided at the edge of the nozzle tip so as to prevent the chemical being sprayed through the minute holes.

Embodiments of the inventive concept provide a chemical supply unit for supplying a chemical to a substrate. The chemical supply unit comprises: an injection nozzle including a nozzle body which includes a liquid line where a chemical flows therein and a nozzle tip which includes a plurality of minute holes extended from the liquid line; a chemical supply line connected with the injection nozzle and configured to supply a liquid to the nozzle body; and a suck-back valve installed on the chemical supply line configured to suck a liquid remaining in the injection nozzle further away from the nozzle tip.

In example embodiments, each of the minute holes may be a polygonal shape and a distance between the minute holes may be provided densely.

In example embodiments, the minute holes located at the center region of the nozzle body may be formed to discharge the liquid in the vertical downward direction, and the minute holes located on the outer side of the nozzle body may be formed so as to approach the minute holes located on the inner side of the nozzle body as they go downward.

In example embodiments, a lower end of the minute holes may be provided at a higher position toward the center of the nozzle tip.

In example embodiments, the liquid may include isopropyl alcohol or ozone.

According to an embodiment, it may have a remarkable effect to prevent chemical dropping by forming minute holes in the injection nozzle to increase the adhesive interface between the chemical and the minute holes.

According to an embodiment, it may have a remarkable effect to minimize the processing defects by making the chemical injected through the minute holes to have a single stream.

The objects of the inventive concept are not limited to the above mentioned effects. Other objects thereof will be understandable by those skilled in the art from the following descriptions and the present application.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

The terminology used herein is for the purpose of describing particular example embodiments and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

It will be understood that, although the terms "first", "second", "third", etc., may be used herein to describe various components they should not be limited by these terms. These terms are only used to distinguish one component from another component.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art.

Figure 1:
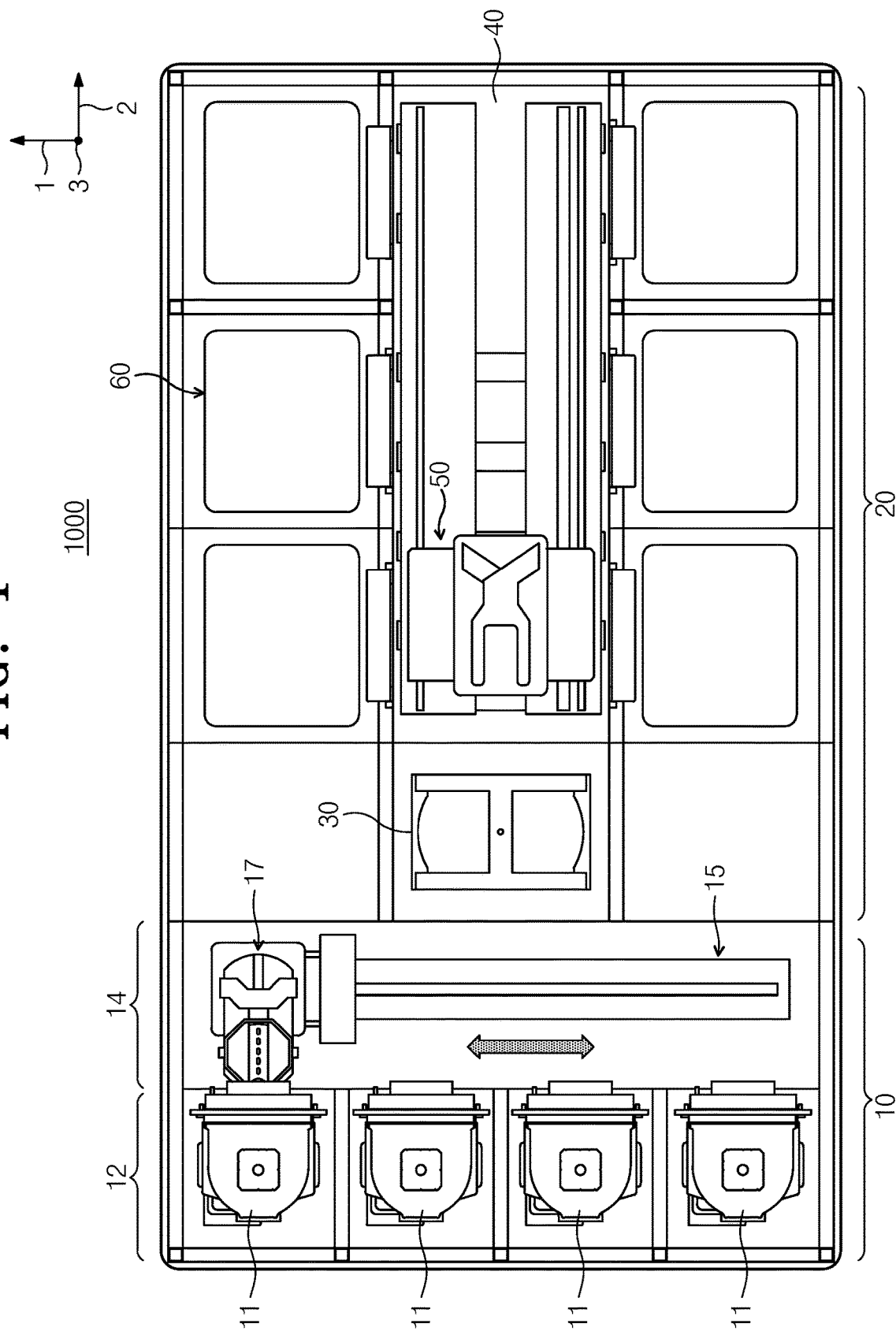
FIG. 1 is a plan view of roughly illustrating a substrate treating system of the inventive concept.

FIG. 1 is a plan view of roughly illustrating a substrate treating system of the inventive concept.

Referring to the FIG. 1, a substrate treating system 1000 comprises an index unit 10 and a process treating unit 20. The index unit 10 and the process treating unit 20 are sequentially arranged in a row. Hereinafter, a direction where the index unit 10 and the process treating unit 20 arranged is referred to as a first direction 1. A direction perpendicular to the first direction 1 is referred to as a second direction 2, when viewed from a top side, and a direction perpendicular to a plane including the first direction 1 and the second direction 2 is referred to as a third direction 3.

The index unit 410 is disposed in front of the first direction 1 of the substrate treating system 1000. The index unit 10 includes a load port 12 and a transfer frame 14.

A carrier 11 where a substrate W is stored is seated on the load port 12. The load port 12 is provided as a plurality of numbers and they are arranged in a row along the second direction 2. The number of load ports 12 may be increased or decreased depending on a requirement like process efficiency and a footprint of the substrate treating apparatus 1000. A front opening unified pod (FOUP) may be used as the carrier 11. In the carrier 11, a plurality of slots (not described) are provided for accommodating the substrates horizontally arranged with respect to the plane.

The transfer frame 14 is arranged in the first direction adjacent to the load port 12. The transfer frame 14 is arranged between a buffer unit 30 of the load port 12 and the process treating unit 20. The transfer frame 14 includes an index rail 15 and an index robot 17. The index robot 17 is seated on the index rail 15. The index robot 17 moves linearly along the index rail 15 to the second direction 2, or rotate about the third direction 3.

The process treating unit 20 is arranged behind the substrate treating system 1000 along the first direction 1 adjacent to the index unit 10. The process treating unit 20 comprises a buffer unit 30, a moving path 40, a main transfer robot 50, and a substrate treating apparatus 60.

The buffer unit 30 is arranged in front of the process treating unit 20 along the first direction 1. The buffer unit 30 provides a space for the substrate W to stay temporarily before transferring the substrate W between the substrate treating apparatus 60 and the carrier 11. The slot (not described) where the substrate W places is provided inside of the buffer unit 30, and the slots (not described) are provided with a plurality of numbers spaced apart from each other along the third direction 30.

The moving path 40 corresponds to the buffer unit 30. The moving path 40 is arranged such that its lengthwise direction is parallel to the first direction 1. The moving path 40 provides a path for the main transfer robot 50 to move. At both ends of the moving path 40, the substrate treating apparatus 60 are arranged along the first direction 1 facing each other. In the moving path 40, the main transfer robot 50 is moved along the first direction 1. In an upper and lower layers of the substrate treating apparatus 60 and upper and lower layers of the buffer unit 30 are provided with movable rails capable of elevating.

The main transfer robot 50 is placed on the moving path 40 and transfers the substrate W between the substrate treating apparatus 60 and the buffer unit 30, or between each of the substrate treating apparatus 60. The main transfer robot 50 moves linearly along moving path 40 to the second direction 2 or rotates on the third direction 3.

The substrate treating apparatus 60 is provided with a plurality of numbers and arranged on both sides of the moving path 40 along the second direction 2. Some of the substrate treating apparatus 60 is placed along the lengthwise direction of the moving path 40. Also, some of the substrate treating apparatus 60 are placed vertically stacked to each other. That is, in one side of the moving path 40, the substrate treating apparatus 60 may be arranged in A×B array. Herein, A is the number of the substrate treating apparatus 60 which are provided along the first direction 1, and B is the number of substrate treating apparatus 60 which are provided along the second direction 2. When four or six substrate treating apparatus 60 are provided on one side of the moving path 40, the substrate treating apparatus 60 may be arranged in 2×2 or 3×2 arrays. The number of the substrate treating apparatus 60 may be increased or decreased. Unlike described above, the substrate treating apparatus 60 may be provided only on one side of the moving path 40. Also, unlike described above, the substrate treating apparatus 60 may be provided as a single layer at both sides of the moving path 40.

The substrate treating apparatus 60 performs a cleaning process. The substrate treating apparatus 60 may have different structure based on the kinds of cleaning processes. The substrate treating apparatus 60 may have the same structure. The substrate treating apparatus 60 may be divided into a plurality of groups, and the substrate treating apparatus 60 provided in the same group may have the same structure, and the substrate treating apparatus 60 provided in a different group may have a different structure. For example, when the substrate treating apparatus 60 is divided into two groups, a first group of the substrate treating apparatus 60 are provided in one side of the transfer chamber 240, and a second group of the substrate treating apparatus 60 are provided in the other side of the transfer chamber 240. Alternatively, a first group of substrate treating apparatuses 60 may be provided on the lower layer on both sides of the transfer chamber 240, and a second group of substrate treating apparatuses 60 may be provided on the upper layer. The substrate treating apparatuses 60 of the first group and the substrate treating apparatuses 60 of the second group may be divided depending on the kinds of chemicals or kinds of cleaning processes used. Alternatively, the first group of substrate treating apparatuses 60 and the second group of substrate treating apparatuses 60 may be provided to sequentially perform processing on one substrate W.

Figure 2:
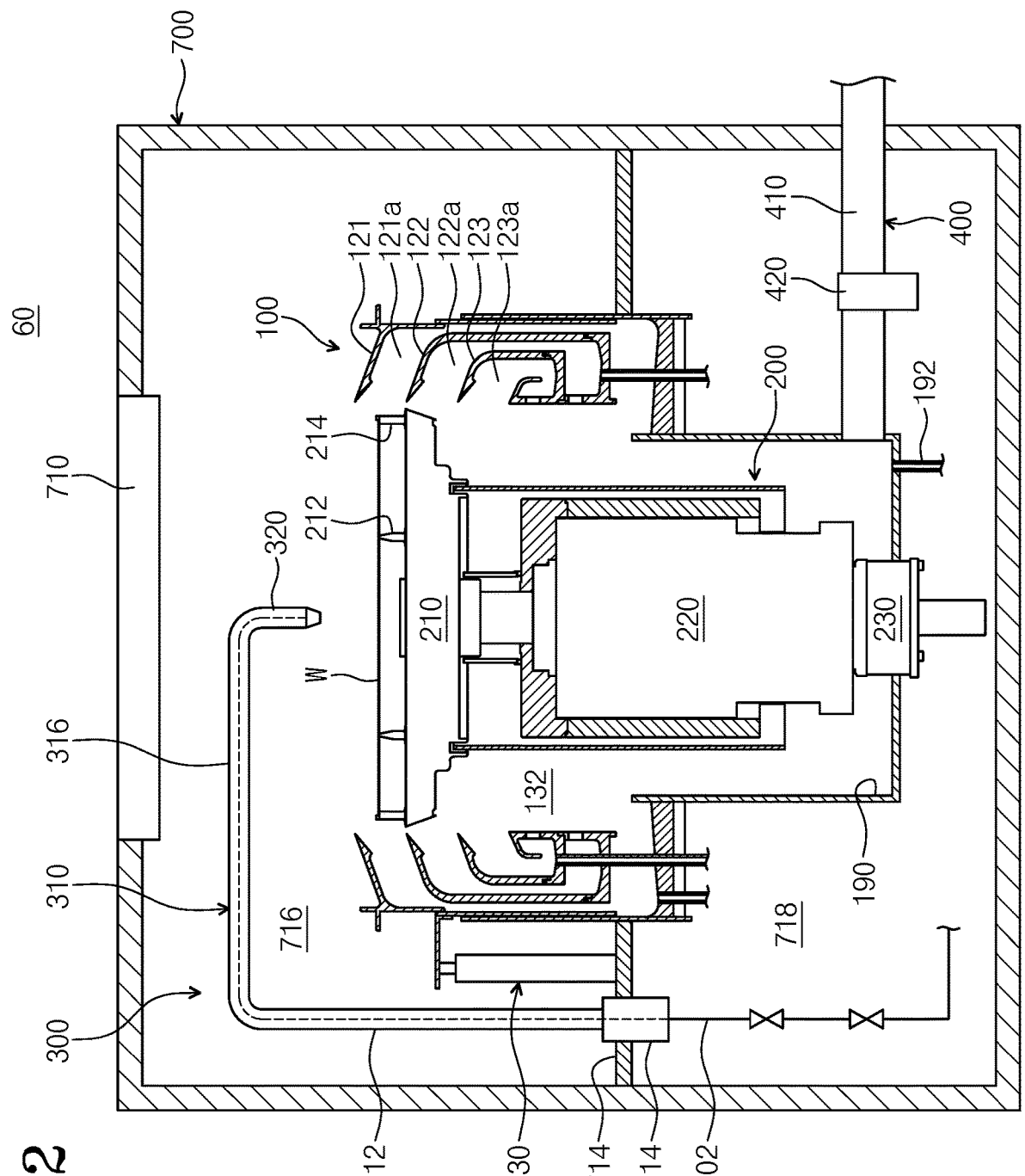
FIG. 2 is a cross sectional view of a substrate treating apparatus.
Figure 3:
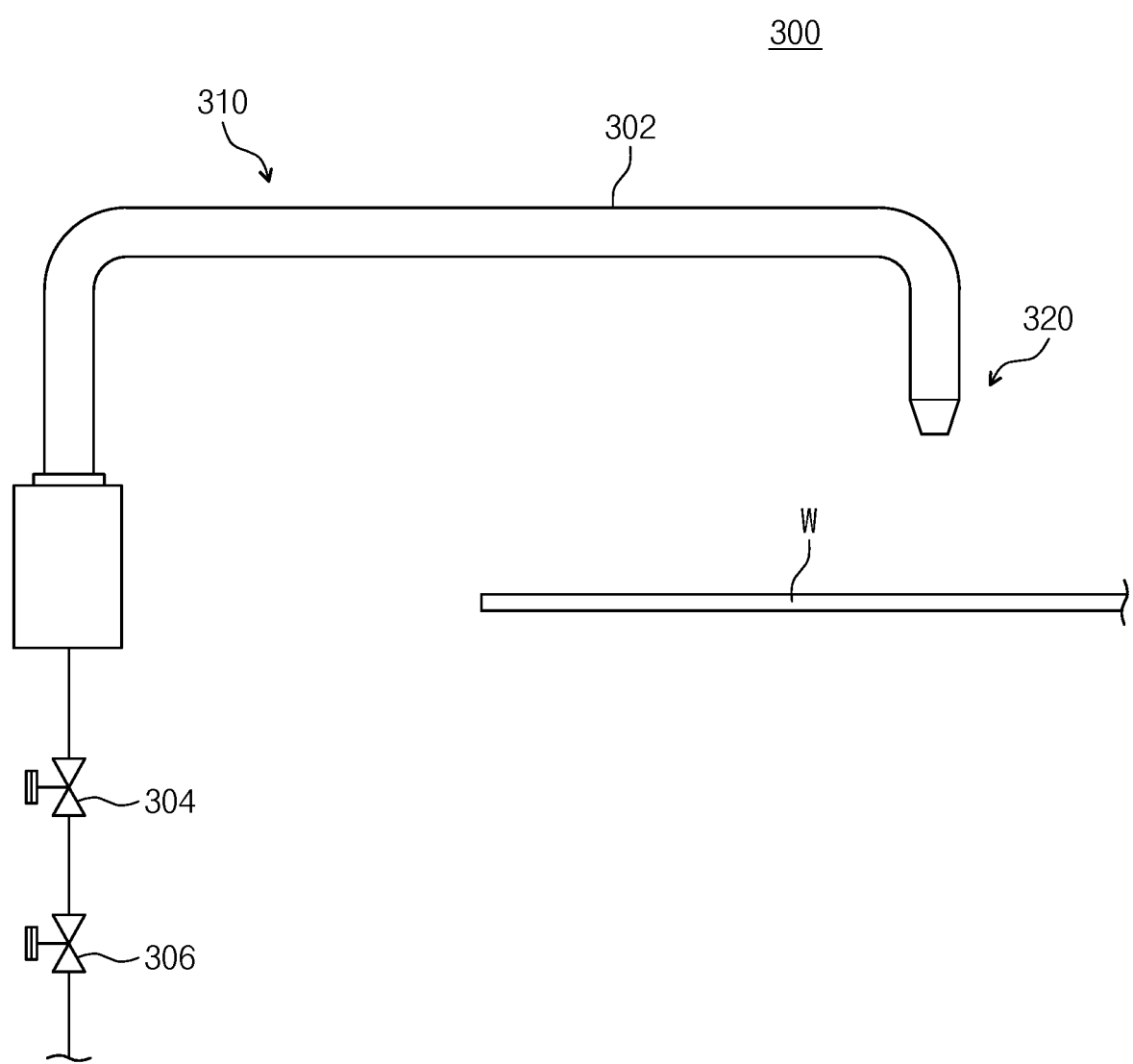
FIG. 3 illustrates a chemical supply unit provided to each substrate treating apparatus.

FIG. 2 is a cross sectional view of a substrate treating apparatus. FIG. 3 illustrates a chemical supply unit provided to each substrate treating apparatus.

In the following embodiments, an apparatus for cleaning a substrate by using chemicals will be described as an example. However, the technical idea of the present invention is not limited to this, and can be applied to various kinds of apparatuses that perform a process while supplying a chemical to a substrate, such as an etching process.

In the present embodiment, the substrate processed by the substrate treating apparatus 60 is exemplified as a semiconductor substrate. However, the present invention is not limited to this and can be applied to various types of substrates such as a glass substrate.

Referring to FIGS. 2 and 3, the substrate treating apparatus 60 comprises a process chamber 700, a treatment container 100, a substrate supporter 200 and a chemical supply unit 300.

The process chamber 700 provides a sealed space therein and a fan filter unit 710 is installed on the top. The fan filter unit 710 generates a vertical airflow inside the process chamber 700.

The fan filter unit 710 is formed by modulating the filter and the air supply fan into one unit and supplies clean air to the inside of the process chamber 700 by filtering. Clean air passes through the fan filter unit 710 and is supplied into the process chamber 700 to form a vertical airflow. Such a vertical airflow of air provides a uniform airflow on the substrate. The contaminated gas such as fumes generated during the treating the substrate surface by the chemical is discharged to an exhaust member 400 through the recovery containers of the treatment container 100 together with the air and removed thereby maintaining cleanliness inside of the treatment container.

The process chamber 700 is divided into a process area 716 and a maintenance area 718 by a horizontal barrier 714. Although only a partial is shown in the drawings, in the maintenance area 718, in addition to the recovery lines 141,145 and the sub-exhaust line 410 connected to the treatment container 100, the maintenance area 718 is provided with a chemical supply line connected to the injection nozzle 320 of the chemical supply unit 300. This maintenance area 718 is preferably isolated from the process area where the substrate treating process is performed.

The treatment container 100 provides a treating space where a substrate W treating process is performed and has an open circular upper side. The open upper side of the treatment container 100 is provided as a path for carrying in and out the substrate W. In the process space, a substrate support member 200 is provided. The treatment container 100 is provided with a second exhaust duct 190 connected to the second exhaust member 400 below the process space. The second exhaust duct 190 is provided with a drain line 192 on the bottom surface thereof.

The treatment container 100 comprises collecting containers 121, 122, 123, and a first elevator member 130.

The collecting containers 121, 122, 123 are disposed in multiple stages for introducing and sucking the chemical liquid and the gas scattered on the substrate to be rotated. Each of the collecting containers 121, 122, 123 may collect different chemicals among the chemicals used in the process.

A third fixed collecting container 123 is provided as a ring shape surrounding a support member 311. A second fixed collecting container 122 is provided as a ring shape surrounding the third fixed collecting container 123. A first fixed collecting container 121 is provided as a ring shape surrounding the second fixed collecting container 122. An inner space 123a of the third fixed collecting container 123, an interspace 122a between the third fixed collecting container 123 and the second fixed collecting container 122, and an interspace between the second fixed collecting container 122 and the first fixed collecting container 121 may function as a inlet where chemical liquid and a gas flows into the third fixed collecting container 123, the second fixed collecting container 122, and the first fixed collecting container 121, respectively.

In the embodiment, the treatment container is shown as having three fixed collecting containers, but the present invention is not limited thereto. The treatment container may include two fixed collecting containers or three or more fixed collecting containers.

The exhaust member 400 is to provide an exhaust pressure into the treatment container 100 when treating the substrate. The second exhaust member 400 comprises a damper 420, a sub-exhaust line 410 connected to the second exhaust duct 190. The sub-exhaust line 410 is supplied with an exhaust pressure from an exhaust pump (not shown) and is connected to the main exhaust line embedded in the bottom space of the semiconductor production line.

The support member 200 rotates the substrate W during the substrate treating process. The support member 200 comprises a spin head 210, a supporting shaft 220, and a rotation driving unit 230. The spin head includes a support pin 212 and a chuck pin 214. The spin head 210 has an upper surface usually provided as a circular form, when viewed from a top side. At the bottom of the spin head 210 the supporting shaft 220 rotatable by a rotation driving unit 230 is fixedly connected.

The chemical supply unit 300 ejects the chemical onto the treating surface of the substrate placed on the spin head 210 of the substrate supporting member 200.

The chemical supply unit 300 may comprise a chemical supply line 302 providing a flow path of the chemical and a discharge member 310 having an injection nozzle 320 connected to the chemical supply line 301 and discharging the chemical.

A SuckBack valve 304 and a valve 306 having a flow rate on/off function may be installed on the chemical supply line 302.

The discharge member 310 may comprise a supporting shaft 312, a driver 314, a nozzle support 316, and an injection nozzle 320. The supporting shaft 312 is provided such that its lengthwise direction is parallel with the third direction 3, and the driver 314 is coupled to the bottom of the supporting shaft 312. The driver 314 rotates and moves the supporting shaft 312 linearly. The nozzle support 316 is coupled to the supporting shaft and moves the discharge nozzle 320 to top of the substrate, or moves the discharge nozzle 320 as discharging the chemical.

The injection nozzle 320 may be installed at the bottom end of the nozzle support 316. The injection nozzle 320 may be move to a processing position and a standby position by the driver 314. The processing position is where the injection nozzle 320 is located vertically above the treatment container 100, and the standby position is where the injection nozzle 320 is not vertically above the treatment container 100. The injection nozzle 320 discharges chemical supplied from the chemical supply line 302. Also, the injection nozzle 320 may discharge a different chemical supplied directly to the nozzle other than the chemical supplied from the chemical supply line 302.

Figure 4:
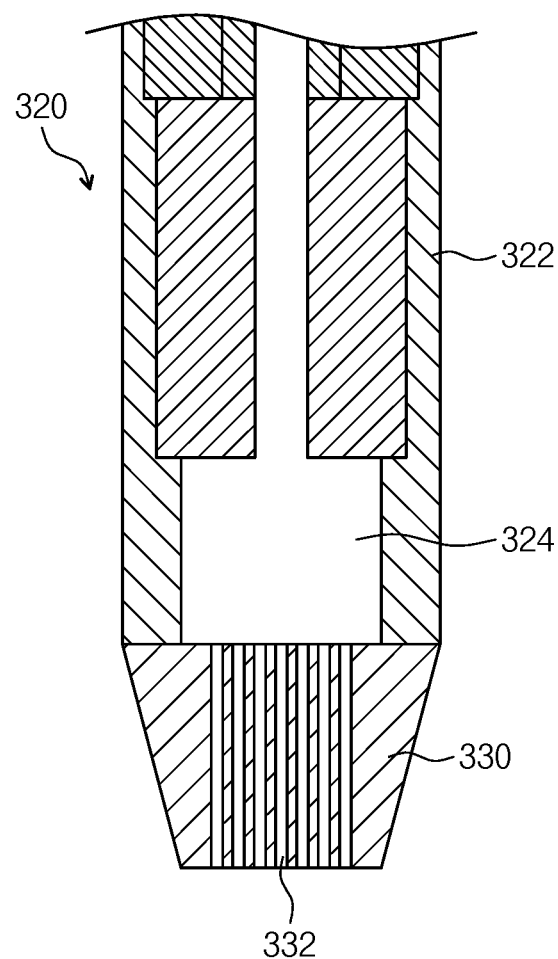
FIG. 4 is a lateral cross sectional view of an injection nozzle.
Figure 5:
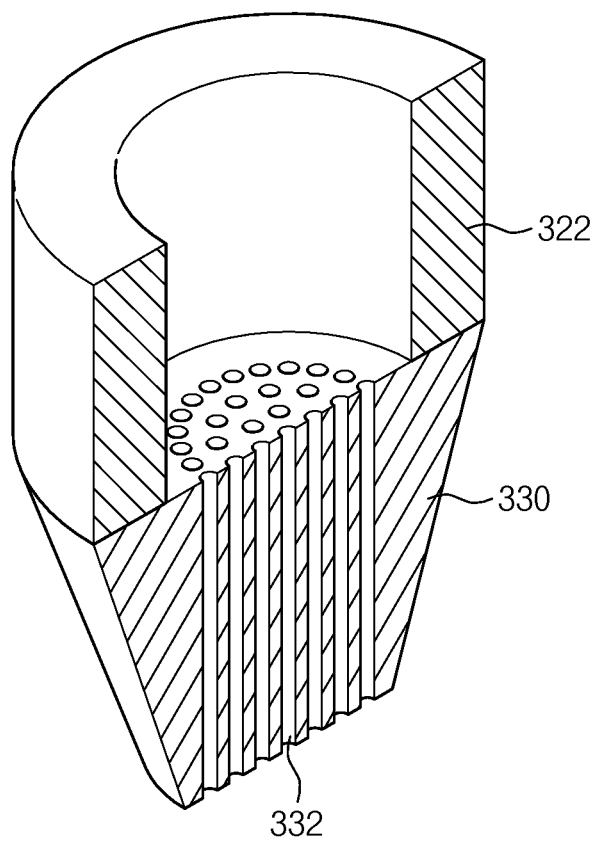
FIG. 5 is an enlarged view of the main part of an injection nozzle.
Figure 6:
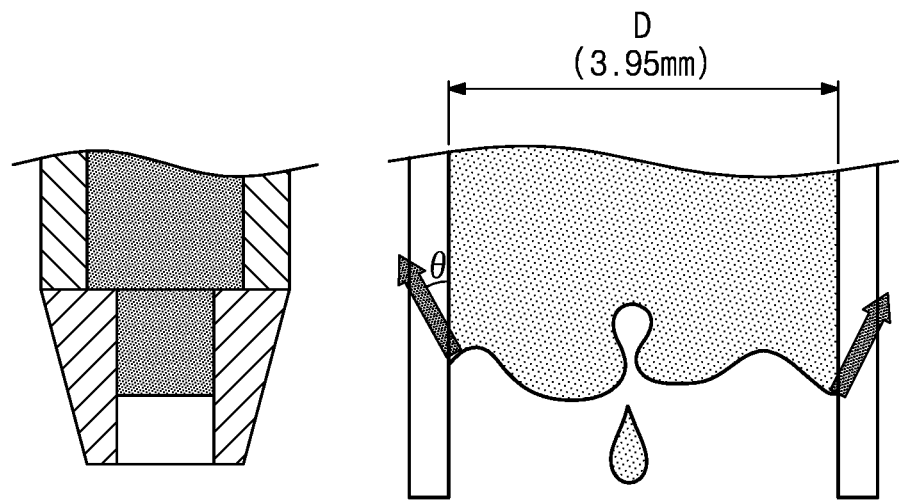
FIG. 6 is an analysis of the force distribution of the conventional injection nozzle and an injection nozzle of the present invention.
Figure 6:
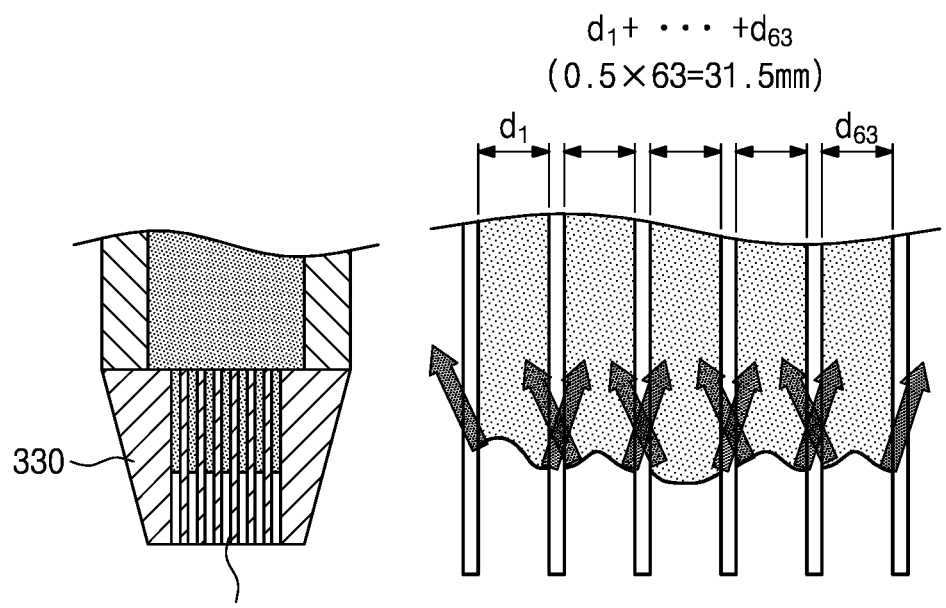

FIG. 4 is a lateral cross sectional view of an injection nozzle. FIG. 5 is an enlarged view of the main part of an injection nozzle. FIG. 6 is an analysis of the force distribution of the conventional injection nozzle and an injection nozzle of the present invention.

Referring to FIGS. 4 to 6, a nozzle body of the injection nozzle includes an inner space for receiving the chemical and minute holes connected to the inner space for discharging the chemical downward.

Like FIG. 6, the force distribution of the conventional injection nozzle and the injection nozzle of the present invention is analyzed as follows: First, in the equation, F=adhesion force, σ=surface tension, and θ=contact angle.

The upper drawing is an example of an existing injection nozzle (hereinafter referred to as a single nozzle) having a ¼" single injection hole. The lower drawing is an example of the injection nozzle of the present invention (hereinafter referred to as a porous nozzle) in which 63 spray holes (minute holes) are opened in a hole having a diameter of 0.5 mm.

The cross-sectional area of a single nozzle is approximately 12.24 mm 2, and the cross-sectional area of a porous nozzle is approximately 12.36 mm 2. Adhesion force is proportional to the bonding interface length (RD) between the chemical, and in the case of the porous nozzle, its length is greatly increased. As a result, an adhesion force of about 8 times is obtained, so that the chemical drop can be effectively prevented.

Figure 7:
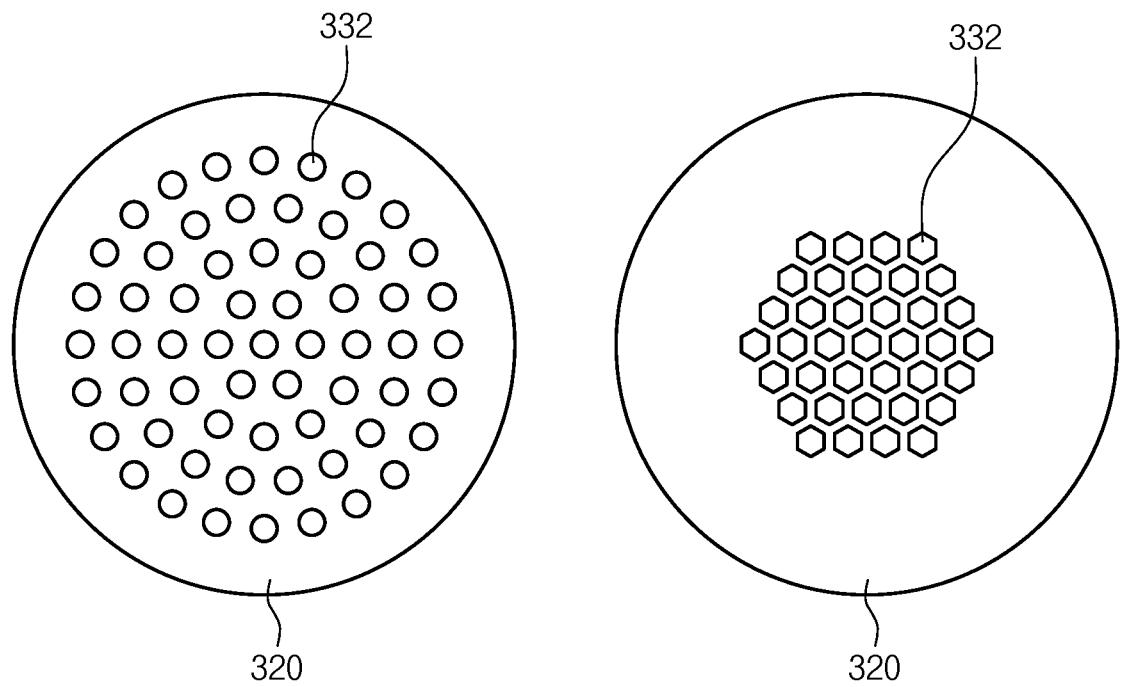
FIG. 7 illustrates various examples of minute holes.

FIG. 7 illustrates various examples of minute holes.

Like FIG. 7, the minute holes 332 of the injection nozzle 320 may be circular or polygonal in cross-sectional shape. Particularly, in the case of minute holes 332 having a hexagonal cross-section, the spacing between the minute holes can be densely provided, or the interval between the minute holes 332 can be constantly provided. That is, the spacing between the minute holes is reduced so that the chemical can accumulate to form a single stream.

Figure 8:
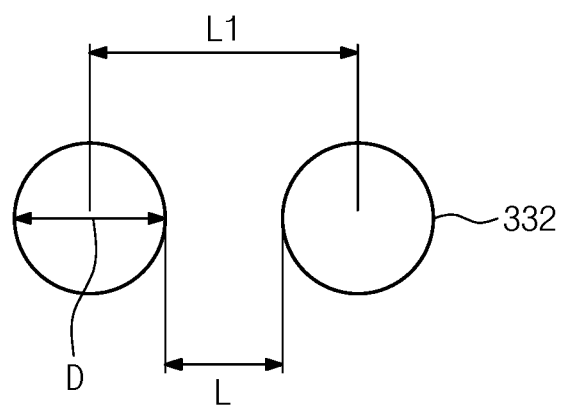
FIG. 8 is a view for explaining the intervals of minute holes.

Referring to FIG. 8, the minute holes may be provided at intervals smaller than the minute hole diameter D. In other words, it is preferable that the interval L1 between the centers of the minute holes is provided not more than twice the minute hole diameter D.

It is difficult to keep the shape of the nozzle end portion constant in the process of processing the minute holes 332. If the end portion is incomplete, the chemical may be split and be discharged. The problem that the chemical is split and injected can be solved by changing the structure of the injection nozzle as described below.

Figure 9:
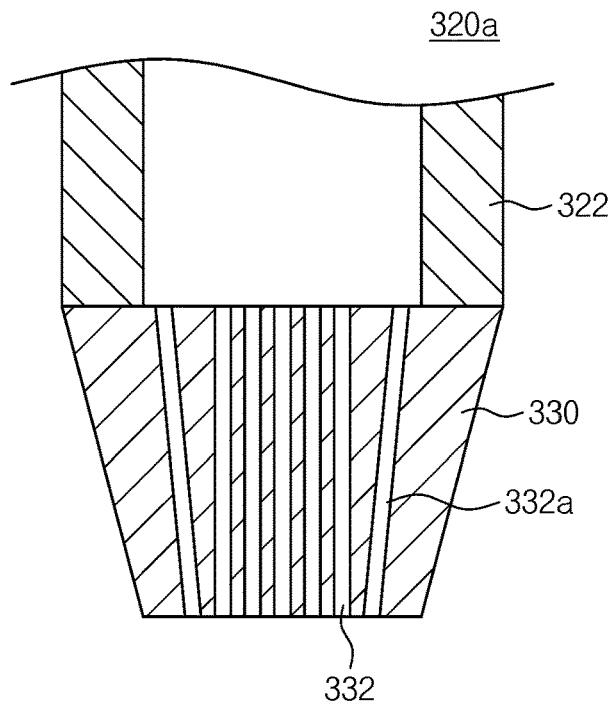
FIG. 9 is a view showing a first modification of the injection nozzle capable of preventing cracking of the chemical.

FIG. 9 is a view showing a first modification of the injection nozzle capable of preventing cracking of the chemical.

Referring to FIG. 9, an injection nozzle 320a is provided to be inclined in the direction of the center of the nozzle body 322 so that the chemical can be collected in the center by the minute holes 322a located at the edges. That is, the injection nozzle 320a is divided into the outermost minute holes 332a and the center minute holes 332, central minute holes 332 are produced vertically, and the outermost minute holes 332a are produced to be inclined toward the central portion so that the chemical can be gathered at the center and be discharged.

Figure 10:
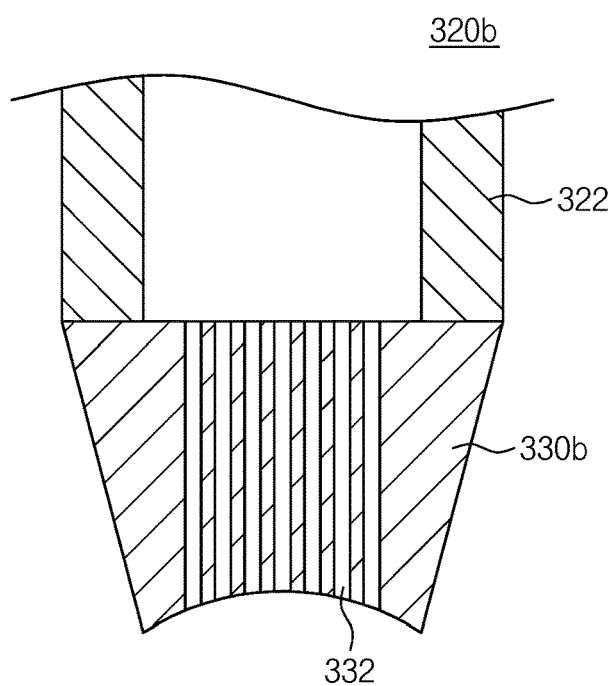
FIG. 10 is a view showing a second modification of the injection nozzle capable of preventing cracking of the chemical.

FIG. 10 is a view showing a second modification of the injection nozzle capable of preventing cracking of the chemical.

Referring to FIG. 10, an injection nozzle 320b can change the shape of a nozzle tip 330b corresponding to the end portion to prevent cracking of the chemical. The injection nozzle 320b has a nozzle tip 330b formed concavely in the outer side thereof so that the chemical injected through the minute holes 332 can be collected at the center and discharged.

Figure 11:
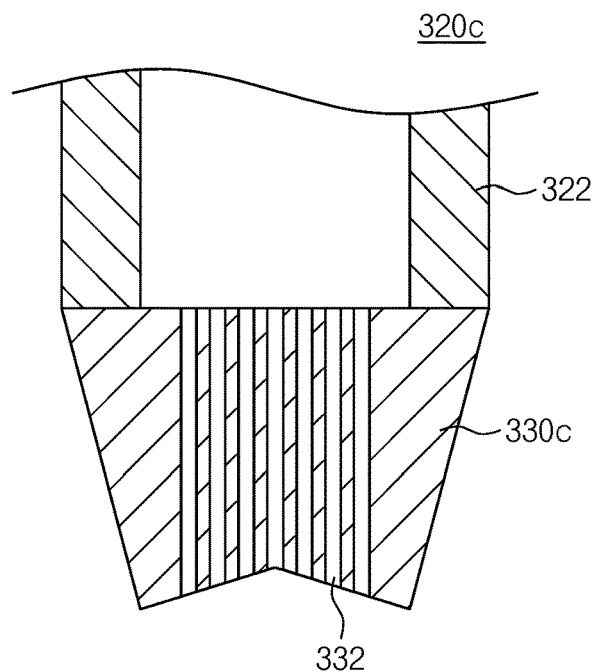
FIG. 11 is a view showing a third modification of the injection nozzle capable of preventing cracking of the chemical.

FIG. 11 is a view showing a third modification of the injection nozzle capable of preventing cracking of the chemical.

Referring to FIG. 11, an injection nozzle 320c can change the shape of a nozzle tip 330c corresponding to the end portion to prevent cracking of the chemical. The injection nozzle 320c has a nozzle tip 330c formed to be inclined downward from the center to the outer side so that the chemical injected through the minute holes 332 can be gathered at the center and be discharged.

Figure 12:
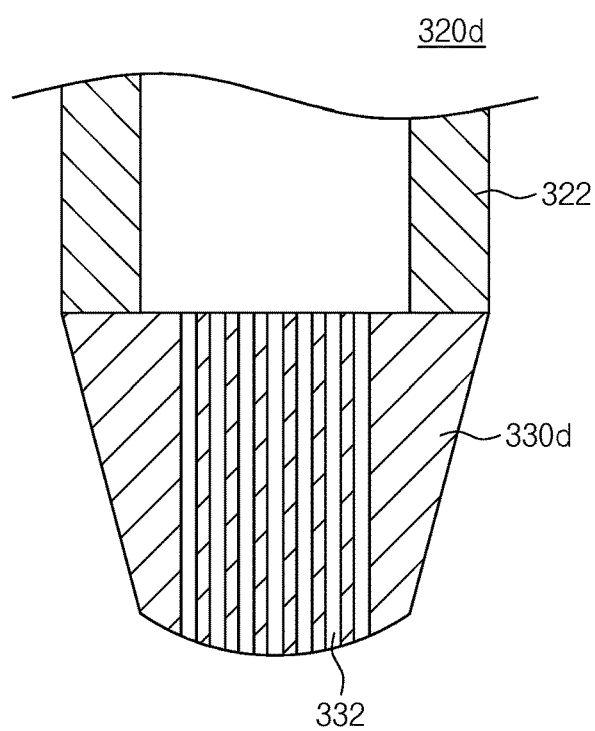
FIG. 12 is a view showing a fourth modification of the injection nozzle.

FIG. 12 is a view showing a fourth modification of the injection nozzle.

Like FIG. 12, a nozzle tip 330d of an injection nozzle 320d may be formed convexly.

Figure 13:
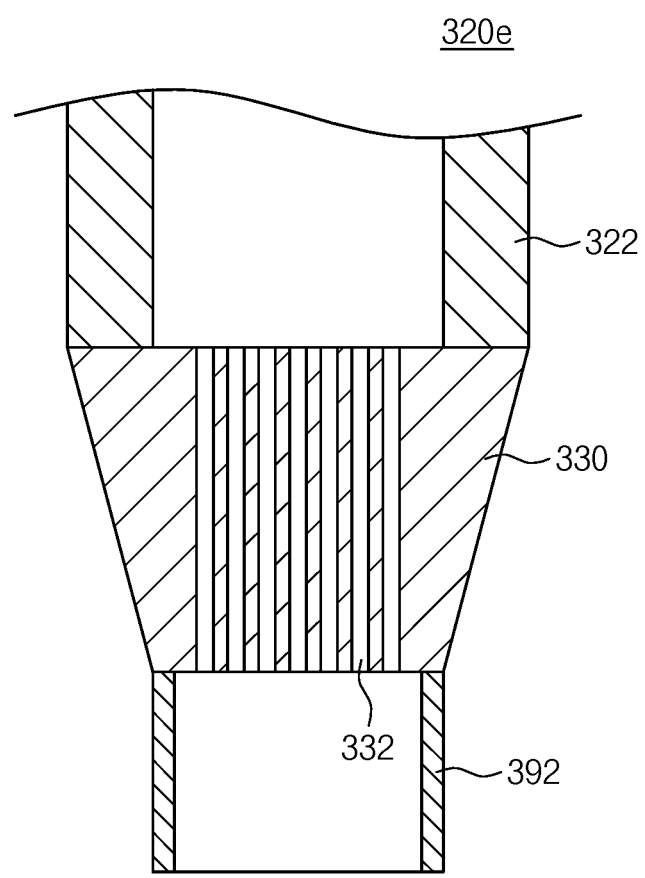
FIG. 13 is a view showing a fifth modification of the injection nozzle.

FIG. 13 is a view showing a fifth modification of the injection nozzle.

An injection nozzle 320e may include a guide 392. The guide 392 is installed at the edge of the nozzle tip 330 so that the chemical discharged through the minute holes 332 does not spread to the surroundings.

Foregoing embodiments are examples of the present invention. Further, the above contents merely illustrate and describe preferred embodiments and embodiments may include various combinations, changes, and environments. That is, it will be appreciated by those skilled in the art that substitutions, modifications and changes may be made in these embodiments without departing from the principles and spirit, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents.

What is claimed is:

1. A substrate treating apparatus comprising:
a housing having a treating space therein;
a spin head for supporting and rotating a substrate in the treating space;
a chemical supply unit having an injection nozzle for supplying a chemical onto the substrate which is supported by the spin head; and
a suck-back valve installed on the chemical supply unit,
wherein the injection nozzle comprises a nozzle body and a nozzle tip,
wherein the nozzle body comprises an inner space configured for filling with a chemical,
wherein the nozzle tip contains a plurality of minute holes which are connected with the inner space for discharging the chemical downward as a single continuous stream of liquid, the minute holes of the plurality of minute holes spaced apart from each other at an interval smaller than a diameter of a single minute hole of the plurality of minute holes,
wherein a bottom of the nozzle tip is configured to have a concave surface wherein the plurality of minute holes are provided, and
wherein the suck-back valve is configured to suck the chemical remaining in the injection nozzle further away from the nozzle tip of the injection nozzle.

2. The apparatus of claim 1, wherein a cross-sectional shape of at least one of the minute holes is selected from a circle, an oval, or a polygon.

3. The apparatus of claim 1, wherein distances between each pair of adjacent minute holes of the plurality of minute holes are the same as each other.

4. A substrate treating apparatus comprising:
a housing having a treating space therein;
a spin head for supporting and rotating a substrate in the treating space;
a chemical supply unit having an injection nozzle for supplying a chemical onto the substrate which is supported by the spin head; and
a suck-back valve installed on the chemical supply unit,
wherein the injection nozzle comprises a nozzle body,
wherein the nozzle body comprises an inner space configured for filling with a chemical and minute holes which are connected with the inner space for discharging the chemical downward, and
wherein the minute holes located at lateral edges of the nozzle body are provided to be inclined toward a center of the nozzle body so that the chemical is configured to be focused toward the center of the nozzle body as a single continuous stream of liquid, the minute holes spaced apart from each other at an interval smaller than a diameter of a single minute hole of the minute holes.

5. A substrate treating apparatus comprising:
a housing having a treating space therein;
a spin head for supporting and rotating a substrate in the treating space;
a chemical supply unit having an injection nozzle for supplying a chemical onto the substrate which is supported by the spin head; and
a suck-back valve installed on the chemical supply unit,
wherein the injection nozzle comprises a nozzle body,
wherein the nozzle body comprises an inner space for filling with a chemical and minute holes which are connected with the inner space for discharging the chemical downward as a single continuous stream of liquid, the minute holes spaced apart from each other at an interval smaller than a diameter of a single minute hole of the minute holes, and wherein the injection nozzle comprises a nozzle tip formed concavely in the outer side of the nozzle body toward the center of the nozzle body.

6. A substrate treating apparatus comprising:
a housing having a treating space therein;
a spin head for supporting and rotating a substrate in the treating space;
a chemical supply unit having an injection nozzle for supplying a chemical onto the substrate which is supported by the spin head; and
a suck-back valve installed on the chemical supply unit,
wherein the injection nozzle comprises a nozzle body and a nozzle tip,
wherein the nozzle body comprises an inner space configured for filling with a chemical,
wherein the nozzle tip contains a plurality of minute holes which are connected with the inner space for discharging the chemical downward as a single continuous stream of liquid, the minute holes of the plurality of minute holes spaced apart from each other at an interval smaller than a diameter of a single minute hole of the plurality of minute holes,
wherein a bottom of the nozzle tip is configured to have a surface wherein the plurality of minute holes are provided,
wherein the surface is configured to be inclined downward from a center of the nozzle tip to an outer side of the nozzle tip, and
wherein the suck-back valve is configured to suck the chemical remaining in the injection nozzle further away from the nozzle tip of the injection nozzle.

7. A substrate treating apparatus comprising:
a housing having a treating space therein;
a spin head for supporting and rotating a substrate in the treating space;
a chemical supply unit having an injection nozzle for supplying a chemical onto the substrate which is supported by the spin head; and
a suck-back valve installed on the chemical supply unit,
wherein the injection nozzle comprises a nozzle body and a nozzle tip,
wherein the nozzle body comprises an inner space configured for filling with a chemical,
wherein the nozzle tip contains a plurality of minute holes which are connected with the inner space for discharging the chemical downward as a single continuous stream of liquid, the minute holes of the plurality of minute holes spaced apart from each other at an interval smaller than a diameter of a single minute hole of the plurality of minute holes,
wherein a bottom of the nozzle tip is configured to have a convex surface wherein the plurality of minute holes are provided, and
wherein the suck-back valve is configured to suck the chemical remaining in the injection nozzle further away from the nozzle tip of the injection nozzle.

* * * * *